(12) United States Patent
Masui et al.

(10) Patent No.: US 10,933,751 B2
(45) Date of Patent: Mar. 2, 2021

(54) POWER DISTRIBUTION SYSTEM

(71) Applicant: Yazaki Corporation, Tokyo (JP)

(72) Inventors: Hideaki Masui, Makinohara (JP);
Katsuyuki Iwasaki, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 15/911,440

(22) Filed: Mar. 5, 2018

(65) Prior Publication Data

US 2018/0334037 A1 Nov. 22, 2018

(30) Foreign Application Priority Data

May 18, 2017 (JP) .............................. JP2017-098660

(51) Int. Cl.
*B60L 3/04* (2006.01)
*B60R 16/033* (2006.01)
(Continued)

(52) U.S. Cl.
CPC .................................... *B60L 3/04* (2013.01);
*B60L 1/00* (2013.01); *B60L 3/0046* (2013.01);
(Continued)

(58) Field of Classification Search
CPC ....................................................... B60L 3/04
(Continued)

(56) References Cited

U.S. PATENT DOCUMENTS 10,065,585 B2 9/2018 Iwasaki et al.
2006/0261779 A1* 11/2006 Maleus ................ H02J 7/0018
320/128
(Continued)

FOREIGN PATENT DOCUMENTS

JP 2003244863 A 8/2003
JP 2008289326 A * 11/2008
(Continued)

OTHER PUBLICATIONS

Google Patents Machine Translation of of Japanese Patent Application Pub. No. JP2008289326A to Yamamoto (downloaded on Feb. 20, 2020).*

(Continued)

*Primary Examiner* — Jean Paul Cass
(74) *Attorney, Agent, or Firm* — Sughrue Mion, PLLC

(57) ABSTRACT

Provided is a power distribution system for improving the reliability of power supply to the load in a case where a bidirectional DC/DC converter is connected to one power supply when redundantly configuring a power supply, including: a first terminal to be connected to a first battery; a second terminal to be connected to a second battery; a load terminal to be connected to a load; a bidirectional DC/DC converter connected between the first terminal and the second terminal; a first relay connected between the first terminal and the load terminal; a second relay connected between the second terminal and the load terminal; a control unit for performing controls of an operation direction of the bidirectional DC/DC converter, an opening and closing operation of the first relay, and an opening and closing operation of the second relay.

7 Claims, 7 Drawing Sheets

(51) Int. Cl.
*H02J 7/00* (2006.01)
*H02M 3/335* (2006.01)
*B60L 3/00* (2019.01)
*B60L 58/20* (2019.01)
*B60L 1/00* (2006.01)
*B60L 50/50* (2019.01)
*G01R 31/327* (2006.01)

(52) U.S. Cl.
CPC .............. *B60L 3/0069* (2013.01); *B60L 50/50* (2019.02); *B60L 58/20* (2019.02); *B60R 16/033* (2013.01); *H02J 7/0014* (2013.01); *H02J 7/0063* (2013.01); *H02J 7/0068* (2013.01); *H02M 3/33584* (2013.01); *B60L 2210/10* (2013.01); *G01R 31/3278* (2013.01); *H02J 2007/0067* (2013.01)

(58) Field of Classification Search
USPC .......................................................... 701/22
See application file for complete search history.

(56) References Cited

U.S. PATENT DOCUMENTS

| | | | | |
|---|---|---|---|---|
| 2009/0256422 A1* | 10/2009 | Fox | ............. | H02J 9/062 307/23 |
| 2011/0025124 A1* | 2/2011 | Brabec | ............. | H02J 7/0032 307/9.1 |
| 2011/0052067 A1* | 3/2011 | Cobb | ............. | G06K 9/6222 382/190 |
| 2011/0149611 A1* | 6/2011 | Moussaoui | ............. | H02M 3/33584 363/21.04 |
| 2012/0052345 A1* | 3/2012 | Kai | ............. | H01M 2/1077 429/61 |
| 2012/0248869 A1* | 10/2012 | Itagaki | ............. | H02J 7/1461 307/9.1 |
| 2013/0049699 A1* | 2/2013 | Jayaraman | ............. | H02M 5/458 320/137 |
| 2013/0140886 A1* | 6/2013 | Bito | ............. | B60L 1/02 307/10.7 |
| 2014/0103883 A1* | 4/2014 | Mitsutani | ............. | B60L 50/16 320/162 |
| 2014/0347013 A1* | 11/2014 | Kim | ............. | G01R 31/382 320/134 |
| 2015/0002073 A1* | 1/2015 | Ju | ............. | H02J 7/02 320/103 |
| 2015/0301120 A1* | 10/2015 | Tran | ............. | G01R 31/3828 324/434 |
| 2017/0080883 A1 | 3/2017 | Yasunori et al. | | |
| 2017/0088071 A1* | 3/2017 | Min | ............. | B60R 16/033 |
| 2017/0125995 A1* | 5/2017 | Nishi | ............. | H02J 7/0063 |
| 2017/0136913 A1* | 5/2017 | Yang | ............. | B60L 58/14 |
| 2017/0149261 A1* | 5/2017 | Yang | ............. | B60S 5/00 |
| 2017/0225634 A1* | 8/2017 | Yasunori | ............. | H02H 1/06 |
| 2017/0225635 A1* | 8/2017 | Obayashi | ............. | H02J 7/0063 |
| 2017/0264126 A1* | 9/2017 | Chazal | ............. | H02J 7/0068 |
| 2017/0346413 A1* | 11/2017 | Dent | ............. | H02J 7/0068 |
| 2017/0358935 A1* | 12/2017 | Saito | ............. | H02J 7/0029 |
| 2018/0026550 A1* | 1/2018 | Dent | ............. | H02J 3/381 363/56.01 |
| 2018/0041048 A1* | 2/2018 | Yang | ............. | B60W 10/08 |
| 2018/0102706 A1* | 4/2018 | Gao | ............. | H02M 3/02 |
| 2018/0138486 A1* | 5/2018 | Wyatt | ............. | H01M 2/206 |
| 2018/0162300 A1* | 6/2018 | Yasunori | ............. | B60R 16/03 |

FOREIGN PATENT DOCUMENTS

| | | |
|---|---|---|
| JP | 2015-214274 A | 12/2015 |
| JP | 201622774 A | 2/2016 |
| JP | 2019030116 A * | 2/2019 |

OTHER PUBLICATIONS

Notice of Reasons for Refusal dated May 7, 2019 from the Japanese Patent Office in application No. 2017-098660.

* cited by examiner

FIG.3A

| | VEHICLE STATE | IG RELAY | SWITCHING RELAY | DC/DC CONTROL | LOAD POWER SUPPLY |
|---|---|---|---|---|---|
| NORMAL | NORMAL RUNNING | ON | OFF | CHARGE DIRECTION | MAIN BATTERY ALTERNATOR |
| | SAILING RUNNING | ON | OFF | DISCHARGE DIRECTION | MAIN BATTERY SUB BATTERY |

FIG.3B

| | VEHICLE STATE | IG RELAY | SWITCHING RELAY | DC/DC CONTROL | LOAD POWER SUPPLY |
|---|---|---|---|---|---|
| FAILURE | MAIN BATTERY FAULT | OFF | ON | STOP | SUB BATTERY |
| | SUB BATTERY FAULT | ON | OFF | STOP | MAIN BATTERY |
| | DC/DC FAILURE | ON | OFF | FAILURE | MAIN BATTERY ALTERNATOR |
| | IG RELAY FAILURE | FAILURE | ON | CHARGE DIRECTION | MAIN BATTERY |
| | SWITCHING RELAY FAILURE | ON | FAILURE | CHARGE DIRECTION | MAIN BATTERY |

FIG.3C

| | VEHICLE STATE | IG RELAY | SWITCHING RELAY | DC/DC CONTROL | LOAD POWER SUPPLY |
|---|---|---|---|---|---|
| DOUBLE FAILURE | MAIN BATTERY FAULT & IG RELAY FAILURE | FAILURE | ON | STOP | SUB BATTERY |
| | MAIN BATTERY FAULT & SWITCHING RELAY FAILURE | ON | FAILURE | DISCHARGE DIRECTION | SUB BATTERY |
| | SUB BATTERY FAULT & IG RELAY FAILURE | FAILURE | ON | CHARGE DIRECTION | MAIN BATTERY |
| | SUB BATTERY FAULT & SWITCHING RELAY | ON | FAILURE | STOP | MAIN BATTERY |

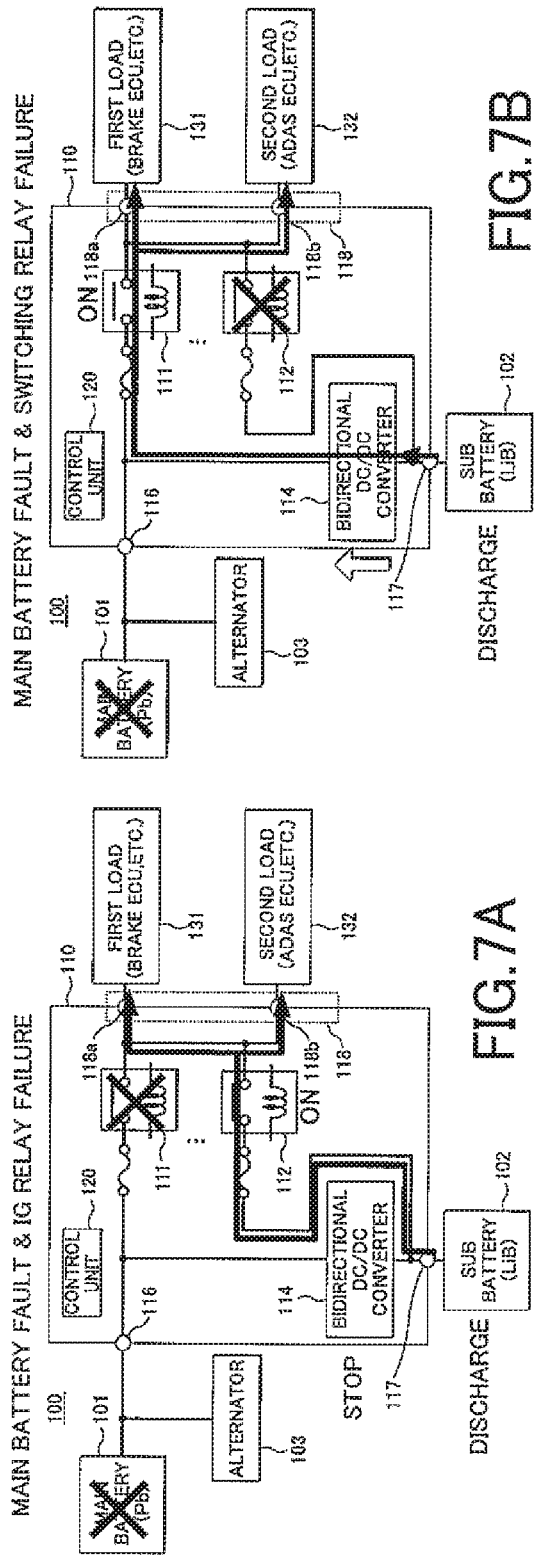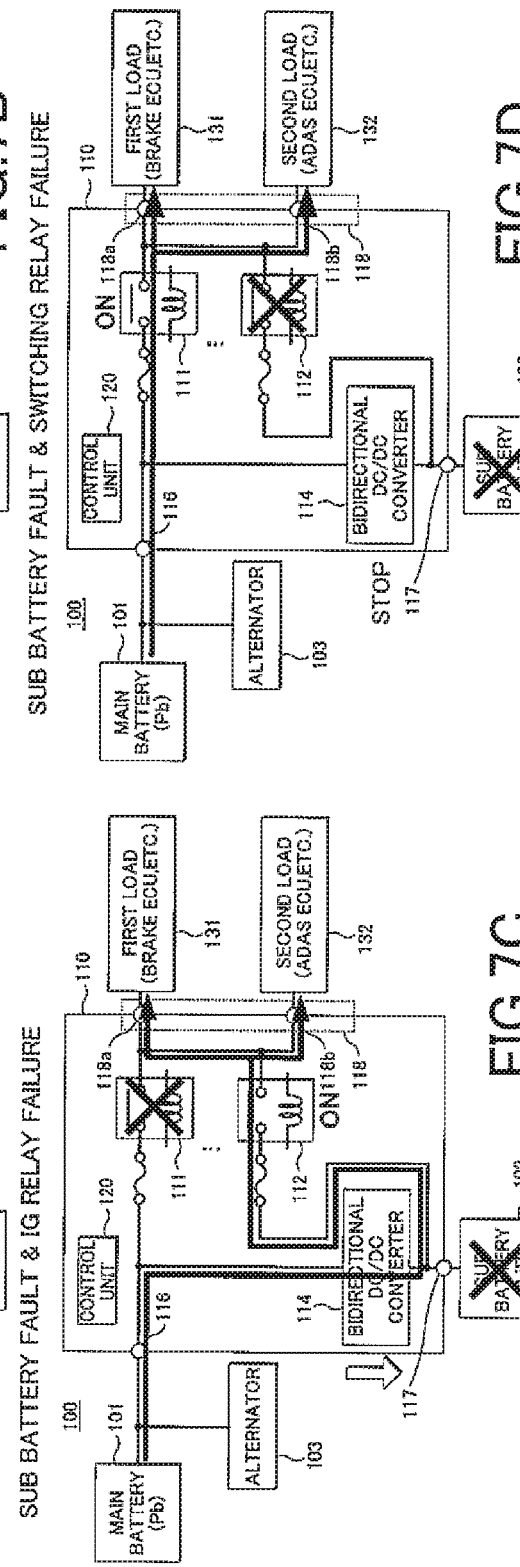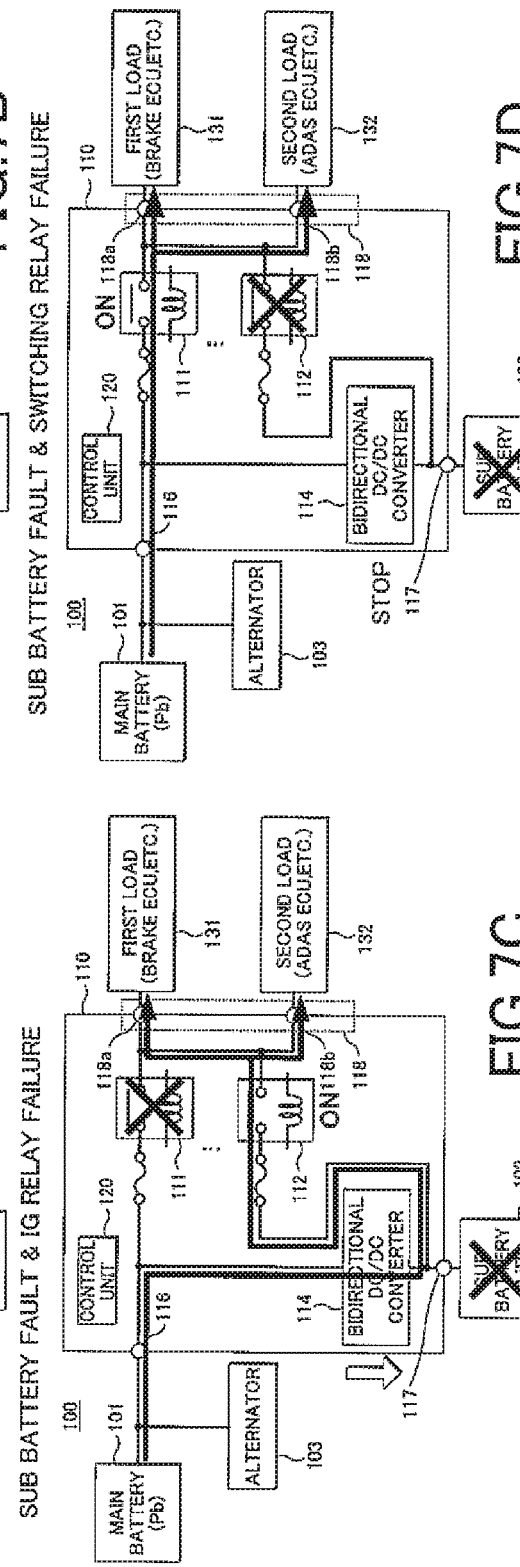

POWER DISTRIBUTION SYSTEM

BACK GROUND OF THE INVENTION

Field of the Invention

The present invention relates to a distribution system connecting a main battery and a sub battery, so as to distribute power to a load.

Description of the Related Art

In recent years, technological development related to ADAS (Advanced Driving Safety Assistance System) of vehicles or automatic operation has advanced. Since the control device or various sensors used for these operate with electric power, the function thereof cannot be sufficiently exerted if the power supply from the power supply is delayed. In order to avoid such situation, it has been carried out to install a plurality of batteries in the vehicle to make the power supply redundant.

Regarding the redundancy of the power supply, Patent Document 1 discloses a power supply device as shown in FIG. 8. In this power supply device, the main battery 301 and the sub battery 302 make the power supply redundant, and both batteries are connected to the power supply box 331. In the power supply box 331, a load 322 such as a motor, and a load 323 such as a lamp are connected in parallel.

A microcomputer 332 is provided in the power supply box 331, and a power supply monitoring unit 333 and a relay control unit 334 are provided. The power source monitoring unit 333 monitors output voltages of the main battery 301 and the sub battery 302 and drives the relay control unit 334 based on the monitoring result, thereby controlling opening and closing operation of the relay 312 of the main battery system and the relay 313 of the sub battery system.

According to the power supply device described in Patent Document 1, for example, it is possible to perform controls of comparing output voltages of the main battery 301 and the sub battery 302 and supply power to the load from the battery having the larger output voltage, or of preventing power from being supplied to the load from the battery whose output voltage is lower than the predetermined threshold. As a result, even when one of the batteries fails, it becomes possible to supply power stably to the load.

Patent Document

Japanese Unexamined Patent Application Publication No. 2015-214274

SUMMARY OF THE INVENTION

When redundant power supply is used, lithium-ion battery has been put to practical use as a sub battery, instead of a conventional lead battery. Though Lithium-ion battery has the features of high energy density, small size and light weight, strict voltage control is required for charging, and a bidirectional DC/DC converter is therefore generally used.

The bidirectional DC/DC converter connected to the lithium-ion battery can take three states of charging direction, discharging direction, and stopping as its operating direction. These motion directions require appropriate control according to the situation of the vehicle and the like.

Therefore, in the power supply device shown in FIG. 8, when a bidirectional DC/DC converter and a lithium ion battery are used instead of the sub battery 302, simply opening and closing control for relays similar to the conventional one cannot improve reliability to be obtained through the battery redundant. In addition, in order to improve the reliability, not only the fault of the battery itself but also the breakdown of the relay etc. is also desirable to consider.

Therefore, in a case where a bidirectional DC/DC converter is connected to one power supply when redundantly configuring the power supply, the present invention aims at improving the reliability of electric power supply to a load.

In order to solve the above problem, a power distribution system according to one embodiment of the present invention includes: a first terminal to be connected to the first battery; a second terminal to be connected to the second battery; a load terminal to be connected to a load; a bidirectional DC/DC converter connected between the first terminal and the second terminal; a first relay connected between the first terminal and the load terminal; a second relay connected between the second terminal and the load terminal; a control unit for performing controls of an operation direction of the bidirectional DC/DC converter, an opening and closing operation of the first relay, and an opening and closing operation of the second relay. Here, the control unit can detect a state in which power is supplied from the first battery, a state in which power is supplied from the second battery, so as to perform the controls. Further, the control unit may further detect an operation state of the bidirectional DC/DC converter, so as to perform the controls. In addition, the control unit further detects an operation state of the first relay and the second relay, so as to perform the controls.

According to the present invention, when the power supply is made redundant, in a case where a bidirectional DC/DC converter is connected to one power supply, the reliability of the power supply to the load can be improved.

BRIEF DESCRIPTION OF THE DRAWINGS

FIGS. 3A to 3C are diagrams for explaining control contents of a relay control unit and a DC/DC converter control unit;

FIGS. 7A to 7D are diagrams for explaining a power transmission path in a double failure.

DETAILED DESCRIPTION OF THE PREFERRED EMBODIMENT

Figure 1:
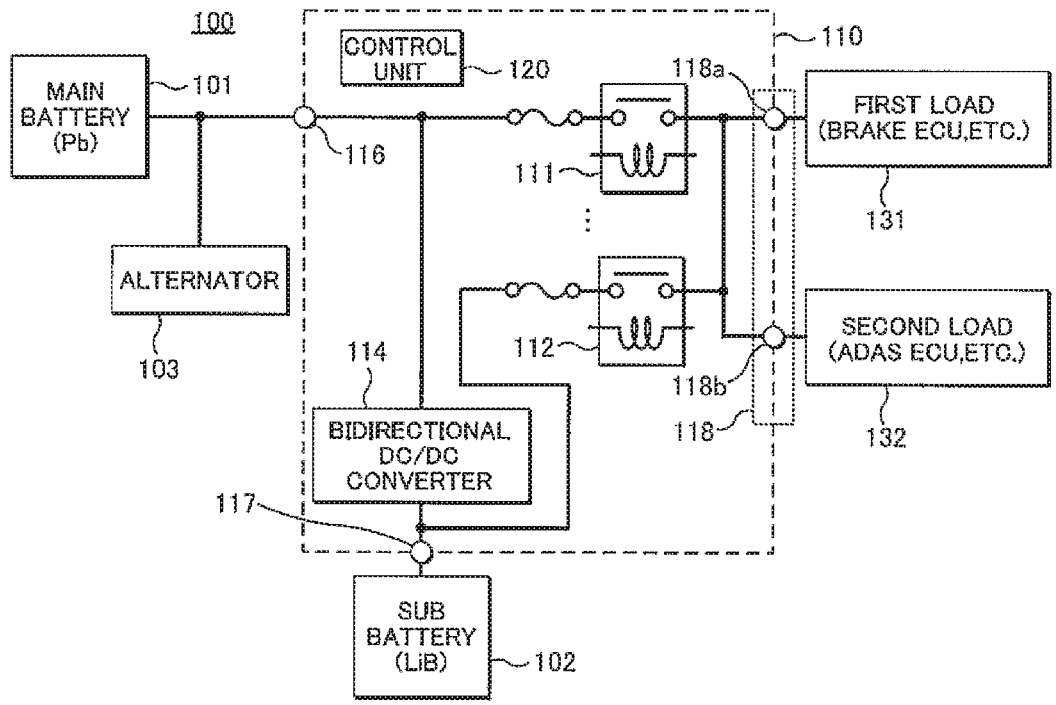
FIG. 1 is a diagram illustrating a power supply device of a vehicle according to a present embodiment.

Embodiments of the present invention will be described in detail with reference to the drawings. FIG. 1 is a diagram illustrating a power supply device 100 of a vehicle according to a present embodiment. The power supply device 100 is made such that a power source is made redundant with a main battery 101 and the sub battery 102, and both batteries are connected to the power distribution system 110.

Further, the power distribution system 110 is provided with a first load 131 such as a brake ECU, a second load 132 such as an ADAS ECU connected thereto. These loads require stable supply electric power while the vehicle is running. However, the load connected to the power distribution system 110 is not limited to these.

The main battery 101 can be, for example, a lead battery (Pb). Moreover, the sub battery 102 can be, for example, a lithium-ion battery (LiB). Since lithium ion battery (LiB) requires strict voltage control during charging, the power distribution system 110 includes a bidirectional DC/DC converter 114. However, the battery used as the sub battery 102 is not limited to a lithium ion battery. For example, a capacitor or the like may be used.

Further, the power distribution system 110 includes an IG relay 111, a switching relay 112, a control unit 120, a main terminal 116 to be connected to the main battery 101, and a sub terminal 117 to be connected to the sub battery 102, and a load terminal 118 to be connected to the load. In the example of this figure, a plurality of load terminals 118 is connected in parallel, and the first load 131 is connected to the load terminal 118a, and the second load 132 is connected to the load terminal 118b. An alternator 103 is also connected to the main terminal 116.

A relay, a power supply wiring, a fuse, a load, etc. that are unnecessary for the description of the present embodiment are not described in the description. The power distribution system 110 is also discriminated between a bidirectional DC/DC converter 114 and a power distribution unit constituted by components other than the power distribution unit. The bidirectional DC/DC converter 114 and the power distribution unit are structured to be integrated. Thereby, it is possible to reduce larger diameter of power supply wires that connect the both, and improve noiseproof property by minimizing the signal line.

The bidirectional DC/DC converter 114 is connected between the main terminal 116 and the sub terminal 117, the IG relay 111 is connected between the main terminal 116 and the load terminal 118, and the switching relay 112 is connected between the sub terminal 117 and the load terminal 118.

For example, the main battery 101 functions as a first battery, the main terminal 116 as a first terminal, and the IG relay 111 as a first relay. Further, the sub battery 102 functions as a second battery, the sub terminal 117 as a second terminal, and the switching relay 112 as a second relay.

The bidirectional DC/DC converter 114 connecting the sub battery 102 via the sub terminal 117 can switch the three states of charging direction, discharging direction, and stopping as its operating direction. A charging direction is a power transfer from the main terminal 116 to the sub terminal 117, and a discharging direction is a power transfer from the sub terminal 117 to the main terminal 116. Here, presence or absence of boost or step down of voltage does not matter. Stopping is a state in which power is not transmitted in either direction.

The control unit 120 can be configured using a microcomputer or the like, and according to a program or the like controls the operation direction of the bidirectional DC/DC converter 114, the opening and closing operation of the IG relay 111, the closing operation of the switching relay 112, and the like.

Figure 2:
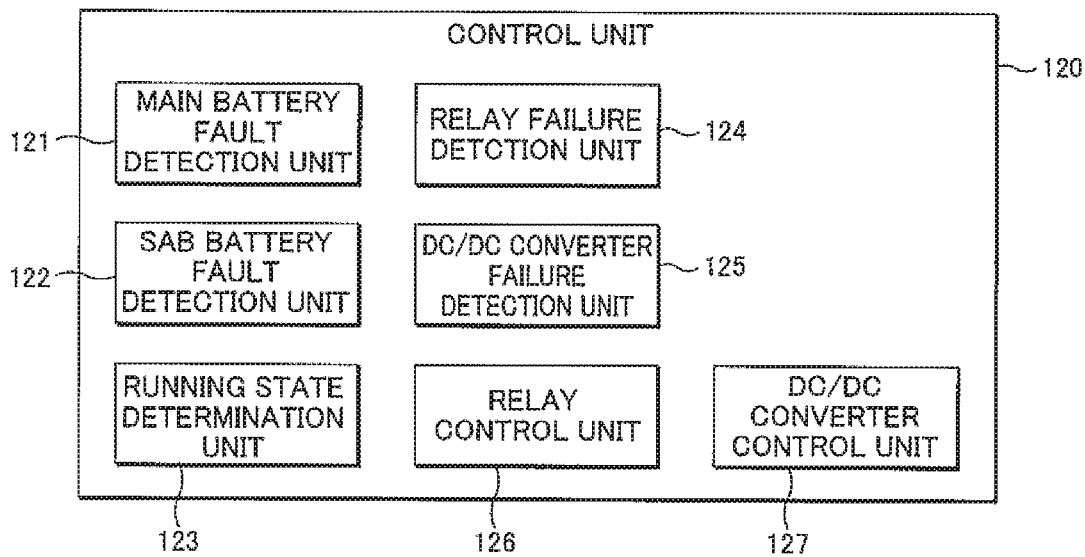
FIG. 2 is a functional block diagram of a control unit.

FIG. 2 is a functional block diagram of the control unit 120. As shown in the figure, the control unit 120 is provided with a main battery fault detection unit 121, a sub battery fault detection unit 122, a running state determination unit 123, a relay fault detector 124, a DC/DC converter fault detector 125, a relay controller 126, and a DC/DC converter control unit 127.

The main battery fault detection unit 121 detects a malfunction of the main battery 101. The fault of the main battery 101 is caused by a voltage drop of the main battery 101, an opening of a main battery system power supply line, or ground fault of the main battery system power supply line, etc. The main battery fault detection unit 121 monitors the output voltage of the main battery 101, etc., thereby detecting the fault of the main battery 101.

The sub battery fault detector 122 detects a malfunction of the sub battery 102. The fault of the sub battery 102 is caused by a voltage drop of the sub battery 102, an opening of the sub battery system power supply line, or ground fault of the sub battery system power supply line, etc. The sub battery fault detector 122 monitors the output voltage of the sub battery 102, for example, thereby detecting the fault of the sub battery 102.

The running state determination unit 123 determines whether the vehicle during traveling is in a normal running state or in a sailing state. Here, the sailing state is a state in which after the acceleration, the engine is stopped and inertial traveling. For example, the traveling state determination unit 123 communicates with the host device, thereby discriminating the running state.

The relay failure detecting unit 124 detects whether the IG relay 111 and the switching relay 112 are in failure (always open). The relay failure detecting unit 124 judges, for example, the relay failure when the conduction state is not established regardless of control of closing.

The DC/DC converter failure detection unit 125 detects the failure of the bidirectional DC/DC converter 114. For example, the DC/DC converter failure detection unit 125 detects a failure of the bidirectional DC/DC converter 114 by communicating with the bidirectional DC/DC converter 114.

The relay control unit 126 controls opening and closing operations of the IG relay 111 and the switching relay 112. The DC/DC converter control unit 127 controls the operation direction of the bidirectional DC/DC converter. The relay control unit 126 and the DC/DC converter control unit 127, as will be described below, based on the detection results by the battery fault detection unit 121, the sub battery fault detection unit 122, the running state determination unit 123, the relay failure detection unit 124, and the DC/DC converter failure detection unit 125, perform control of each of them.

FIG. 3 illustrates control contents of the relay control unit 126 and the DC/DC converter control unit 127. In this figure, a state where the vehicle is normally traveling (FIG. 3A), a state where a failure or the like occurs in one of the main battery 101, the sub battery 102, the bidirectional DC/DC converter 114, the IG relay 111, and the switching relays 112 (FIG. 3B), and a state where a double failure occurs (FIG. 3C) are discriminated.

In the present embodiment, that both the IG relay 111 and the switching relay 112 simultaneously fail, and that both the main battery 101 and the sub battery 102 fail simultaneously are assumed to be extremely low probability, so they are not supposed to be assumed.

A normally running state (FIG. 3A), that is, if none of the main battery fault detection unit 121, the sub battery fault detection unit 122, the relay failure detection unit 124, and the DC/DC converter fault detection 125 has detected abnormality, and if it is normal running, the relay control part 126 turns on the IG relay 111 (close) and turns off the switching relay 112 (open), and the DC/DC converter control unit 127 sets the operation direction of the bidirectional DC/DC converter 114 to the charge direction.

Figure 4A:
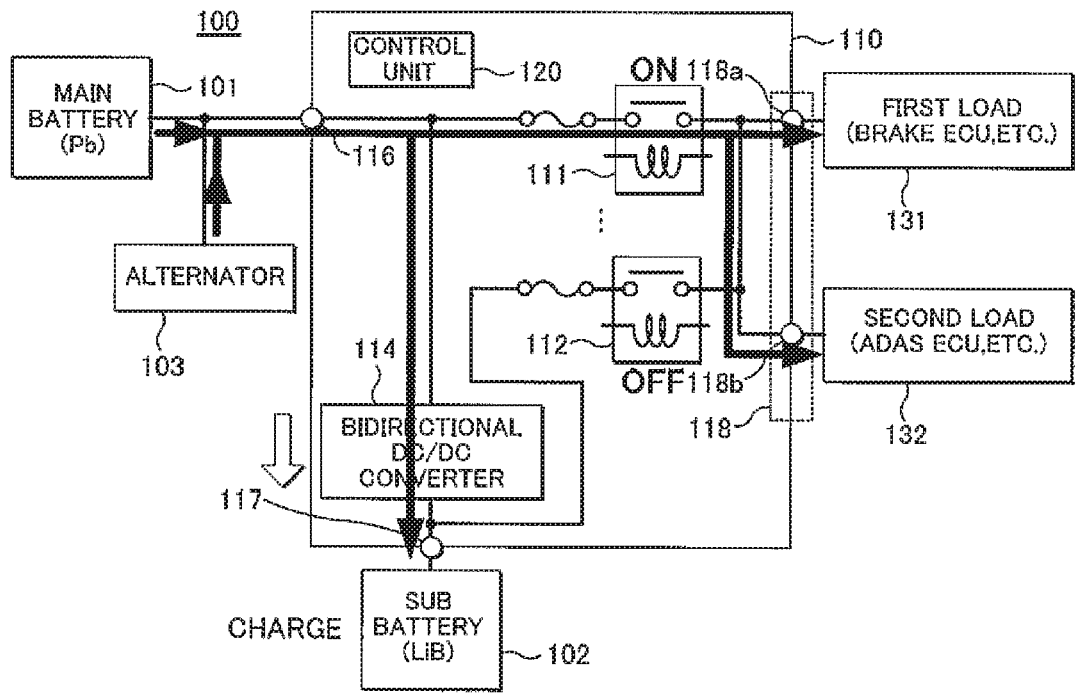
FIGS. 4A and 4B are diagrams for explaining a power transmission path during normal traveling.

As a result, power is supplied to the load from the main battery 101 and the alternator 103. The sub battery 102 is also charged. FIG. 4A schematically shows the power supply path of the power supply.

On the other hand, in the case of sailing running in a state where the vehicle is traveling normally, the relay control unit 126 turns on the IG relay 111, and turns off the switching relay 112, and the DC/DC converter control unit 127 sets the operation direction of the bidirectional DC/DC converter 114 to the discharge direction. This is because the alternator 103 does not generate electricity during sailing.

Figure 4B:
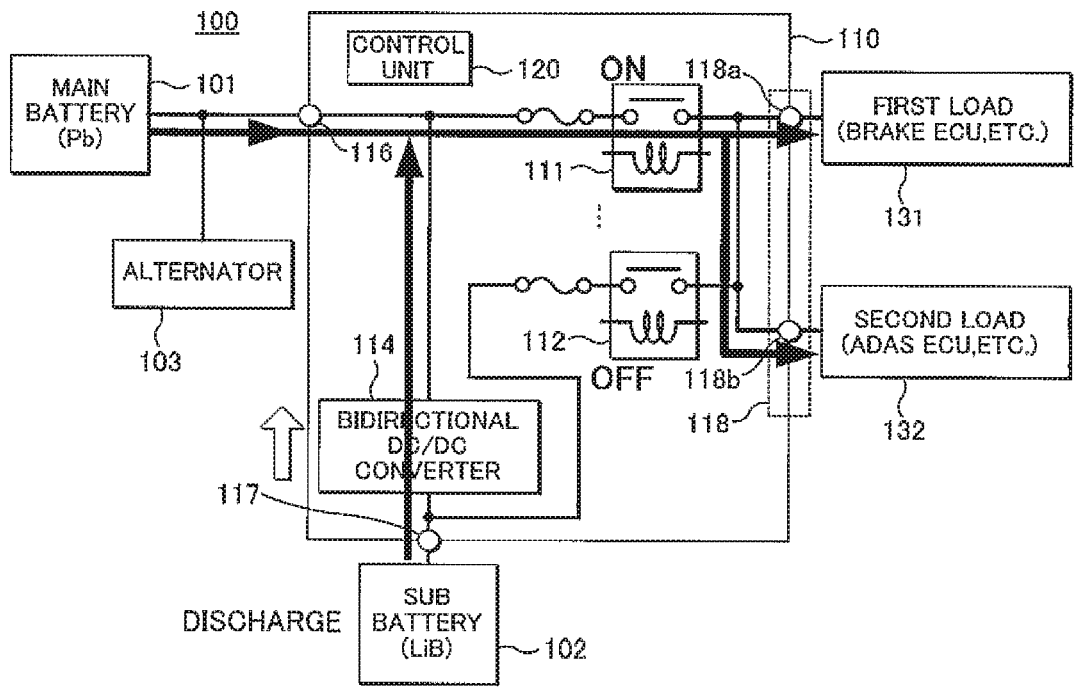

As a result, power is supplied to the load from the main battery 101 and the sub battery 102. FIG. 4B schematically shows the power supply path at this time.

In a state where a fault occurs in one location (FIG. 3B), that is, when any one of the main battery fault detection unit 121, the sub battery fault detection unit 122, the relay failure detection unit 124, the DC/DC converter failure detection unit 125 detects a failure, the following control is performed.

In the case of the main battery fault, the relay control unit 126 turns off the IG relay 111, and turns on the switching relay 112, and the DC/DC converter control unit 127 stops the bidirectional DC/DC converter 114.

Figure 5A:
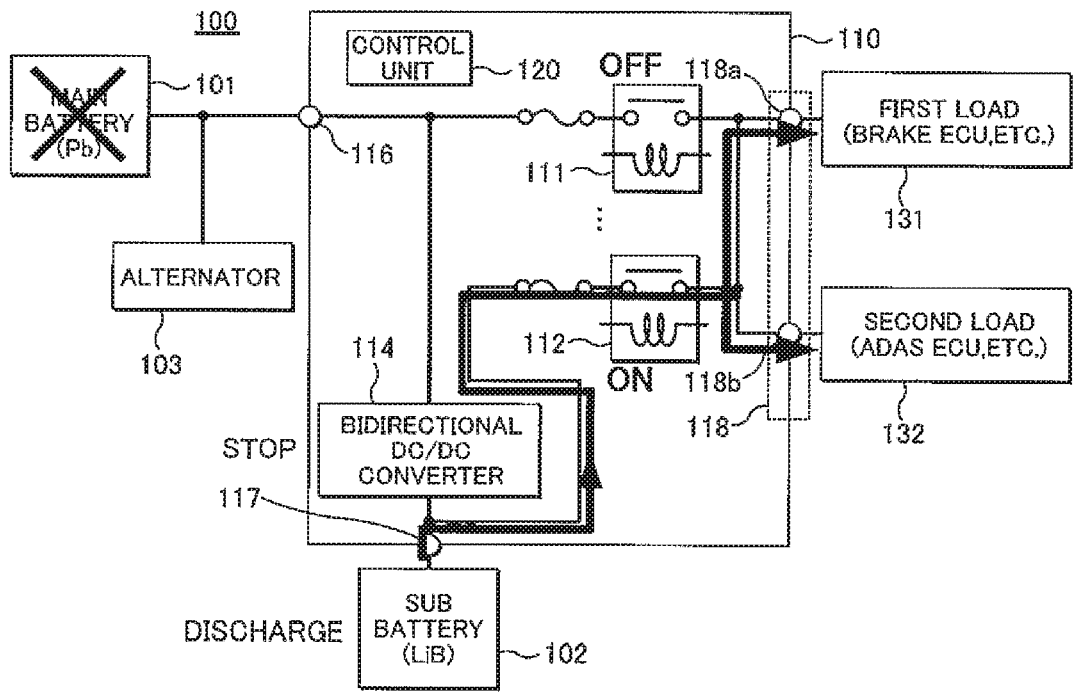
FIGS. 5A and 5B are diagrams for explaining a power transmission path when a battery fails.

As a result, power is supplied to the load from the sub battery 102. FIG. 5A schematically shows the power supply path at this time.

In the case of a sub battery fault, the relay control unit 126 turns on the IG relay 111 and turns off the switching relay 112, and the DC/DC converter control unit 127 stops the bidirectional DC/DC converter 114.

Figure 5B:
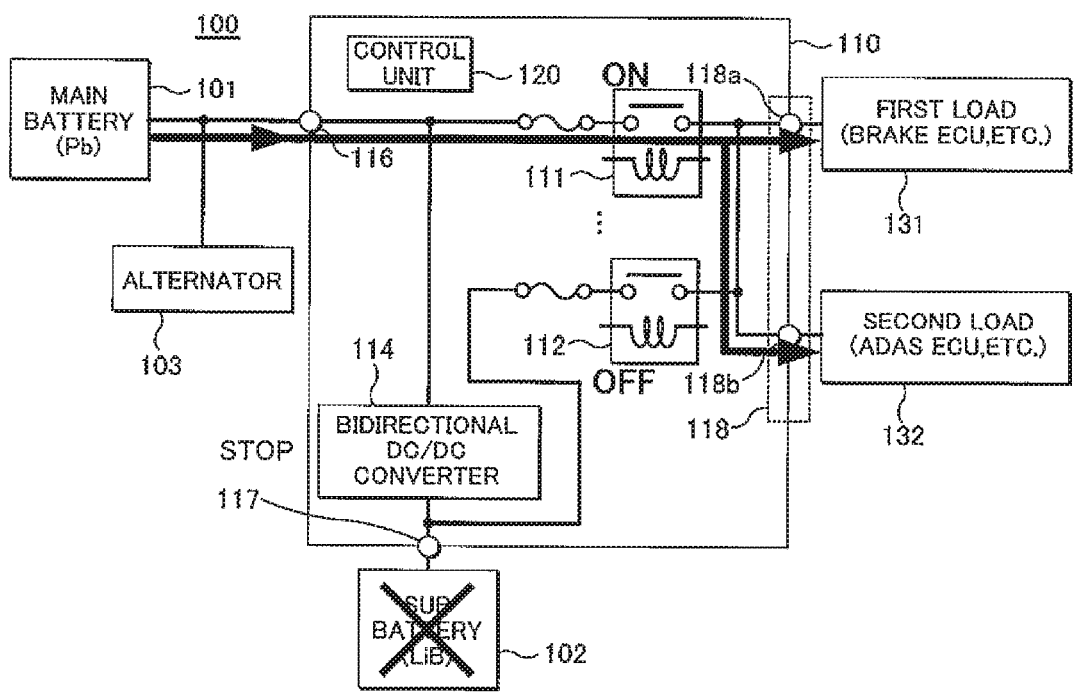

As a result, power is supplied to the load from the main battery 101. FIG. 5B schematically shows the power supply path at this time. In addition to the main battery 101, power may also be supplied from the alternator 103.

Figure 6A:
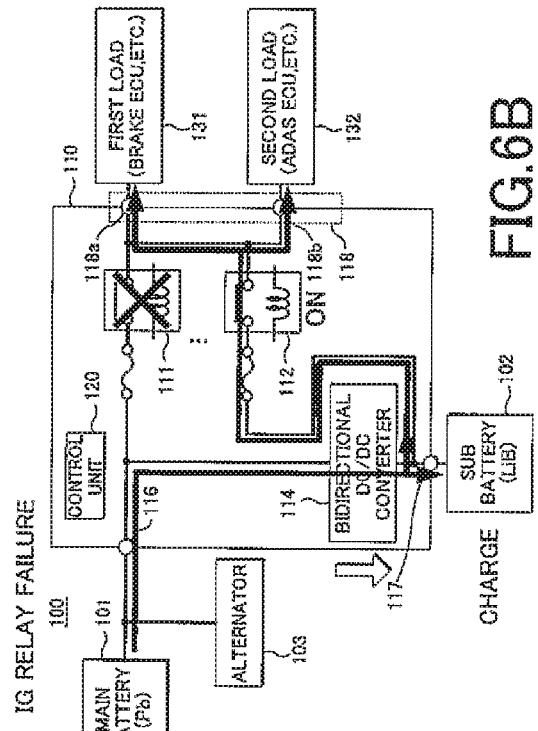
FIGS. 6A to 6C are diagrams for explaining a power transmission path at a failure.

In the case of a failure of the bidirectional DC/DC converter 114, the relay control unit 126 turns on the IG relay 111 and turns off the switching relay 112. As a result, power is supplied to the load from the main battery 101 and the alternator 103. FIG. 6A schematically shows the power supply path at this time.

Figure 6B:
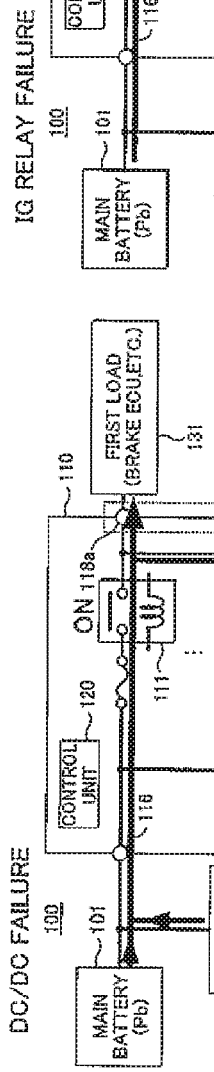

When the IG relay 111 fails, the relay control unit 126 turns on the switching relay 112, and the DC/DC converter control unit 127 sets the operation of the bidirectional DC/DC converter 114 to charge direction. As a result, power is supplied to the load from the main battery 101. The sub battery 102 is also charged. FIG. 6B schematically shows the power supply path at this time. In addition to the main battery 101, power may be supplied from the alternator 103.

Figure 6C:
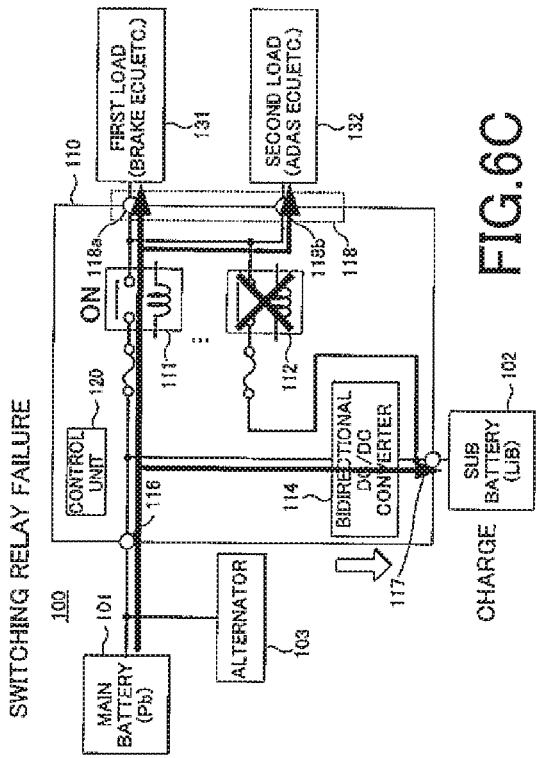
Figure 8:
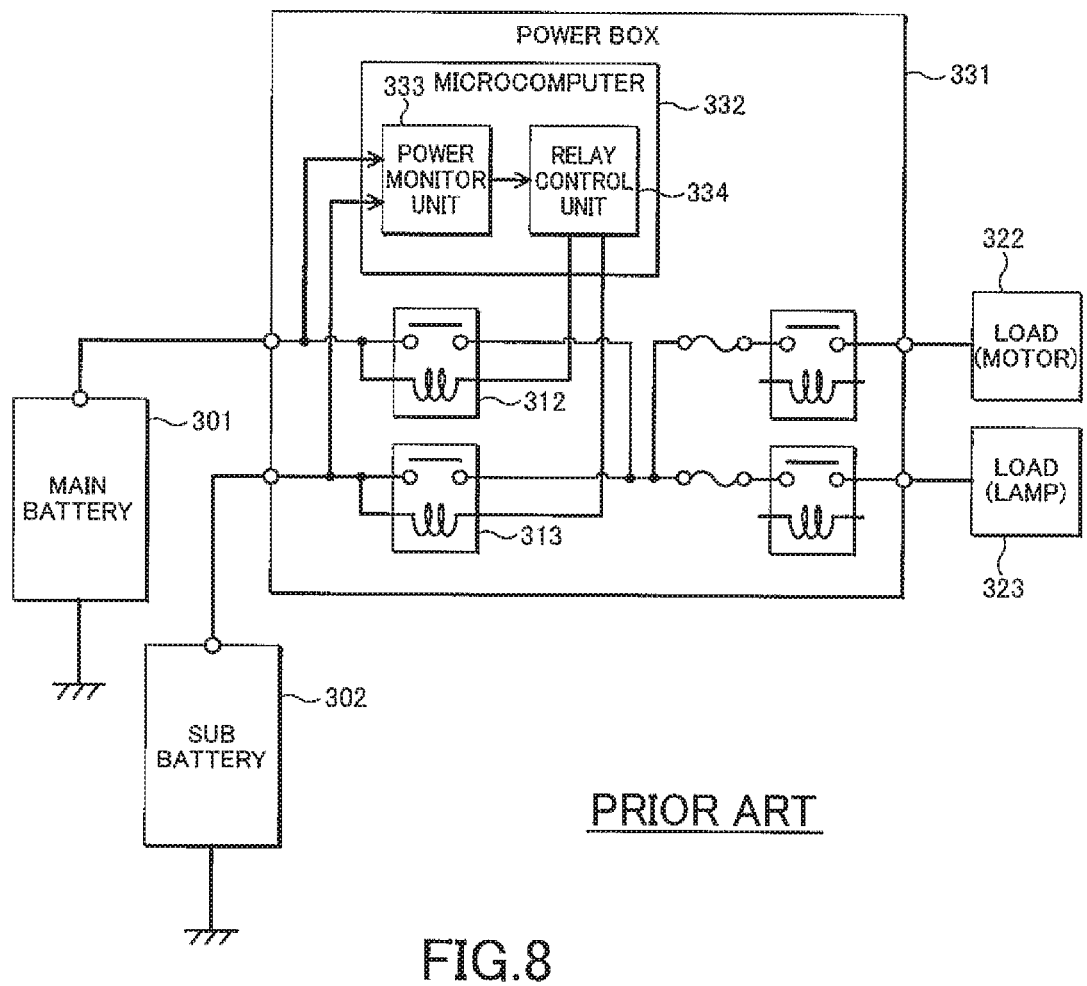
FIG. 8 is a diagram showing an example of conventional power supply redundancy.

In the case of a failure of the switching relay 112, the relay control unit 126 turns on the IG relay 111, in addition, the DC/DC converter control unit 127 sets the operation of the bidirectional DC/DC converter 114 to charge direction. As a result, power is supplied to the load from the main battery 101. The sub battery 102 is also charged. FIG. 6C schematically shows the power supply path at this time. In addition to the main battery 101, power may be supplied from the alternator 103.

In a state where a double failure occurs (FIG. 3C), that is, two of the main battery fault detection unit 121, the sub battery fault detector 122, the relay failure detector 124, and the DC/DC converter fail, the following control is performed.

When the main battery fault and the IG relay fault occur simultaneously, the relay control unit 126 turns on the switching relay 112 and the DC/DC converter control unit 127 stops the bidirectional D/CDC converter 114.

As a result, power is supplied to the load from the sub battery 102. FIG. 7A schematically shows the power supply path at this time.

When the main battery fault and the switching relay failure occur simultaneously, the relay control unit 126 turns on the IG relay 111 and the DC/DC converter control unit 127 sets the operational direction of the bidirectional DC/DC converter 114 to the discharge direction.

As a result, power is supplied to the load from the sub battery 102. FIG. 7B schematically shows the power supply path at this time.

If the sub battery fault and the IG relay failure occur simultaneously, the relay control unit 126 turns on the switching relay 112 and the DC/DC converter control unit 127 sets the operational direction of the bidirectional DC/DC converter 114 to the charging direction.

As a result, power is supplied to the load from the main battery 101. FIG. 7C schematically shows the power supply path at this time. In addition to the main battery 101, power may also be supplied from the alternator 103.

When the sub battery fault and the switching relay failure occur at the same time, the relay control unit 126 turns on the IG relay 111 and the DC/DC converter control unit 127 stops the bidirectional DC/DC converter 114.

As a result, power is supplied to the load from the main battery 101. FIG. 7D schematically shows the power supply path at this time. In addition to the main battery 101, power may also be supplied from the alternator 103.

As described above, in the power distribution system 110 of the present embodiment, the bidirectional DCDC convertor is connected between the main terminal 116 and the sub terminal 117, and the switching relay 112 is connected between the sub terminal 117 and the load terminal 118. As a result, since cutting off the power supply path taking into consideration of the loss of the battery itself in addition to the failure of relays and the bidirectional DC/DC converter, it is possible to improve the reliability of the power supply to the load.

DESCRIPTION OF SYMBOLS

100 Power Supply
101 Main battery
102 Sub battery
103 Alternator
110 Power Distribution System
111 IG relay
112 Switching relay
114 Bidirectional DC/DC converter
116 Main terminal
117 Sub terminal
118 Load terminal
120 Control unit
121 Main battery fault detector
122 Sub battery fault detector
123 Traveling state discrimination unit
124 Relay failure detection unit
125 DC/DC converter failure detection unit
126 Relay control unit
127 DC/DC converter control unit
131 First load
132 Second load

What is claimed is:
1. A power distribution system, comprising:
a first terminal to be connected to a first battery;
a second terminal to be connected to a second battery;
a load terminal to be connected to a load;

a bidirectional DC/DC converter connected between the first terminal and the second terminal;

a first relay connected between the first terminal and the load terminal;

a second relay connected between the second terminal and the load terminal; and a control unit configured to perform controls of an operation direction of the bidirectional DC/DC converter, an opening and closing operation of the first relay, and an opening and closing operation of the second relay wherein, based on the power distribution system operating in a first state, the control unit is configured to control the bidirectional DC/DC converter to operate hi a first direction to supply power from the first battery through the bidirectional DC/DC converter to a side of the second terminal, and based on the power distribution system operating in a second state, the control unit is configured to control the bidirectional DC/DC converter to operate in a second direction to supply power from the second battery through the bidirectional DC/DC converter to a side of the first terminal, and wherein the control unit controls the bidirectional DC/DC converter to stop, the first relay to open, and the second relay to be closed upon detecting a fault of the first battery.

2. The power distribution system according to claim 1, wherein
the control unit detects a state in which power is supplied from the first battery, and a state in which power is supplied from the second battery, so as to perform the controls.

3. The power distribution system according to claim 2, wherein
the control unit further detects an operation state of the bidirectional DC/DC converter, so as to perform the controls.

4. The power distribution system according to claim 2,
the control unit further detects an operation state of the first relay and the second relay, so as to perform the controls.

5. The power distribution system according to claim 3,
the control unit further detects an operation state of the first relay and the second relay, so as to perform the controls.

6. The power distribution system according to claim 1, wherein the bidirectional DC/DC converter is disposed directly in an electrical path between the first terminal and the second terminal.

7. The power distribution system according to claim 1, wherein the control unit controls the bidirectional DC/DC converter to operate in the first direction to charge the second battery, and controls the bidirectional DC/DC converter to operate in the second direction to discharge the second battery.

* * * * *